US008610266B2

(12) United States Patent
Chan et al.

(10) Patent No.: US 8,610,266 B2
(45) Date of Patent: Dec. 17, 2013

(54) SEMICONDUCTOR DEVICE FOR RADIO FREQUENCY APPLICATIONS AND METHOD FOR MAKING THE SAME

(75) Inventors: Kai Chong Chan, Singapore (SG); Gerald Ofner, Singapore (SG)

(73) Assignee: Infineon Technologies AG, Munich (DE)

( * ) Notice: Subject to any disclaimer, the term of this patent is extended or adjusted under 35 U.S.C. 154(b) by 1052 days.

(21) Appl. No.: 11/470,056

(22) Filed: Sep. 5, 2006

(65) Prior Publication Data

US 2007/0075410 A1   Apr. 5, 2007

Related U.S. Application Data

(63) Continuation of application No. PCT/IB2004/000610, filed on Mar. 5, 2004.

(51) Int. Cl.
*H01L 23/48* (2006.01)
*H01L 23/52* (2006.01)
*H01L 29/40* (2006.01)

(52) U.S. Cl.
USPC ........... 257/737; 257/659; 257/660; 257/678; 257/685; 257/723; 257/734; 257/738; 257/787; 257/E23.001; 257/E23.114; 257/E23.116; 257/E23.021; 257/E23.069; 174/260; 174/257; 228/180.22; 361/768

(58) Field of Classification Search
USPC ......... 257/734, 737, 659, 660, 678, 685, 686, 257/723, 738, 777, 787, E23.001, E23.114, 257/E23.116, E23.021, E23.069; 174/260, 174/257; 228/180.22; 361/768
See application file for complete search history.

(56) References Cited

U.S. PATENT DOCUMENTS

| | | | | |
|---|---|---|---|---|
| 3,761,309 A | * | 9/1973 | Schmitter et al. | 428/600 |
| 3,809,625 A | | 5/1974 | Brown et al. | |
| 5,625,230 A | | 4/1997 | Park et al. | 257/736 |
| 5,666,270 A | | 9/1997 | Matsuda et al. | 361/704 |
| 5,998,875 A | * | 12/1999 | Bodo et al. | 257/778 |
| 6,073,829 A | | 6/2000 | Pienimaa | 228/180.22 |
| 6,177,729 B1 | * | 1/2001 | Benenati et al. | 257/738 |
| 6,271,111 B1 | | 8/2001 | Farooq et al. | 438/614 |
| 6,277,669 B1 | | 8/2001 | Kung et al. | 438/106 |
| 6,303,408 B1 | * | 10/2001 | Smith | 438/106 |
| 6,337,445 B1 | * | 1/2002 | Abbott et al. | 174/260 |
| 6,471,115 B1 | | 10/2002 | Ijuin et al. | 228/180.22 |
| 6,546,620 B1 | * | 4/2003 | Juskey et al. | 29/840 |

(Continued)

FOREIGN PATENT DOCUMENTS

| | | | | |
|---|---|---|---|---|
| DE | 10105351 A1 | 8/2002 | | H01L 23/50 |
| EP | 0602328 A2 | 9/1993 | | H01L 21/60 |

(Continued)

OTHER PUBLICATIONS

International Search Report with Written Opinion, PCT/IB2004/00610, 18 pages, Date Mailed Jan. 3, 2005.

*Primary Examiner* — Meiya Li
(74) *Attorney, Agent, or Firm* — Banner & Witcoff, Ltd.

(57) ABSTRACT

A semiconductor device (5) for radio frequency applications has a semiconductor chip (1) with an integrated circuit accommodated in a radio frequency package. Inside bumps (2) comprise inside contacts between the semiconductor chip (1) and a redistribution substrate (3). The inside bumps (2) have a metallic or plastic core (6) and a coating layer (7) of a noble metal.

12 Claims, 2 Drawing Sheets

(56) References Cited

U.S. PATENT DOCUMENTS

| | | | |
|---|---|---|---|
| 6,610,591 B1 | 8/2003 | Jiang et al. | 438/613 |
| 2002/0070463 A1* | 6/2002 | Chang et al. | 257/780 |
| 2002/0111016 A1* | 8/2002 | Farquhar et al. | 438/637 |
| 2002/0179689 A1* | 12/2002 | Tung | 228/197 |
| 2003/0049884 A1 | 3/2003 | Lutz | 438/106 |
| 2003/0080420 A1* | 5/2003 | Ohara | 257/737 |
| 2003/0151140 A1* | 8/2003 | Nishiyama et al. | 257/737 |
| 2003/0193094 A1* | 10/2003 | Takahashi et al. | 257/780 |
| 2004/0195591 A1* | 10/2004 | Gehman et al. | 257/202 |
| 2005/0040541 A1* | 2/2005 | Kurita et al. | 257/778 |

FOREIGN PATENT DOCUMENTS

| | | | |
|---|---|---|---|
| JP | 2253626 | 12/1990 | H01L 21/92 |
| WO | 0074132 A1 | 12/2000 | H01L 21/48 |
| WO | 0156081 A1 | 8/2001 | H01L 23/498 |

* cited by examiner

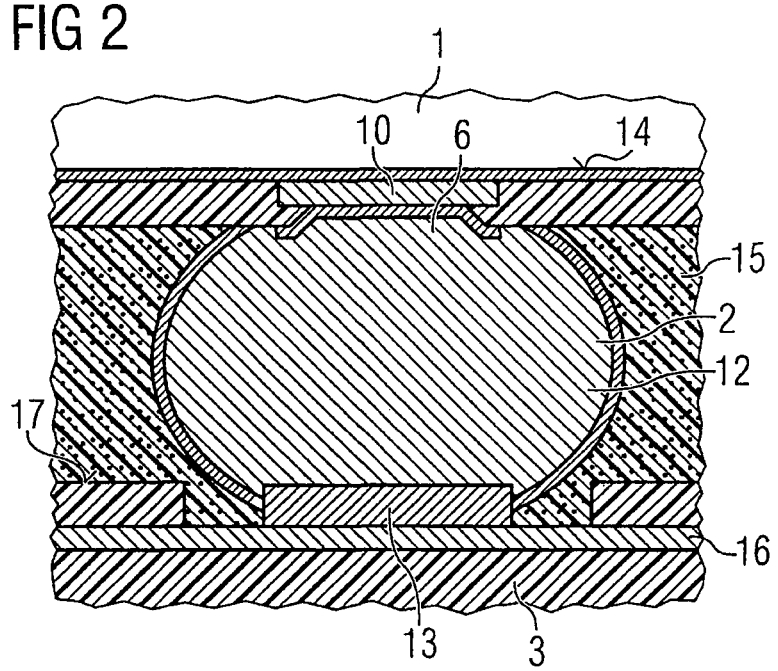
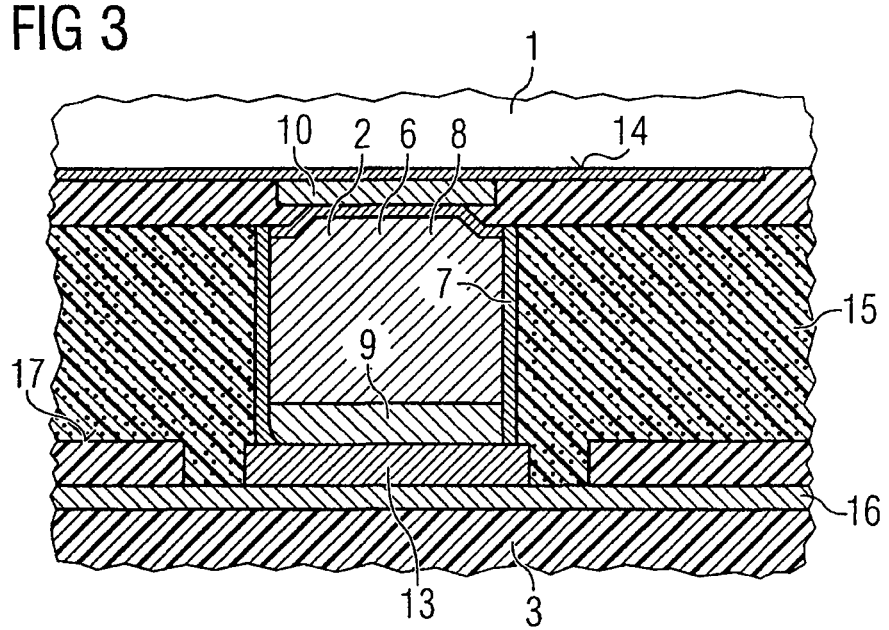

SEMICONDUCTOR DEVICE FOR RADIO FREQUENCY APPLICATIONS AND METHOD FOR MAKING THE SAME

CROSS-REFERENCE TO RELATED APPLICATION

This application is a continuation of co-pending International Application No. PCT/IB2004/000610 filed Mar. 5, 2004, and which is incorporated herein by reference in its entirety.

TECHNICAL FIELD

The invention relates to a semiconductor device for radio frequency applications and a method for making the same. This semiconductor device comprises a semiconductor chip accommodated in a radio frequency package. The semiconductor chip has inside bumps attached to a redistribution substrate. Further, there are outside bumps forming outside contacts of the semiconductor device. These outside bumps are mounted on said redistribution substrate.

BACKGROUND

Such semiconductor devices are well known in the prior art. But the transmission frequency range is limited, even if a flip chip shape is considered to shorten the internal conductor path of said semiconductor device from the contact pads on the active surface of said semiconductor chip to outside contact pads of a ball grid array on said redistribution substrate.

SUMMARY

A semiconductor device for radio frequency applications with an enhanced limit of the transmission frequency can be provided by having a semiconductor chip accommodated in a radio frequency package. The semiconductor chip comprises on its active surface contact pads of a noble metal, and inside bumps as inside contacts, positioned between the contact pads of the semiconductor chip and landing pads on a surface of a redistribution substrate. Further, said semiconductor device comprises outside bumps as outside contacts, positioned on outside contact pads on a surface of said redistribution substrate, opposite to said surface carrying the semiconductor chip. The inside bumps of said semiconductor chip have a metallic or plastic core and a coating layer of a noble metal.

BRIEF DESCRIPTION OF THE DRAWINGS

The invention is now described in more detail with reference to the attached drawings, wherein:

FIG. 2 shows a schematic cross-sectional view of an inside bump, according to an embodiment;

FIG. 3 shows a schematic cross-sectional view of an inside bump, according to second embodiment.

DETAILED DESCRIPTION

Figure 1:
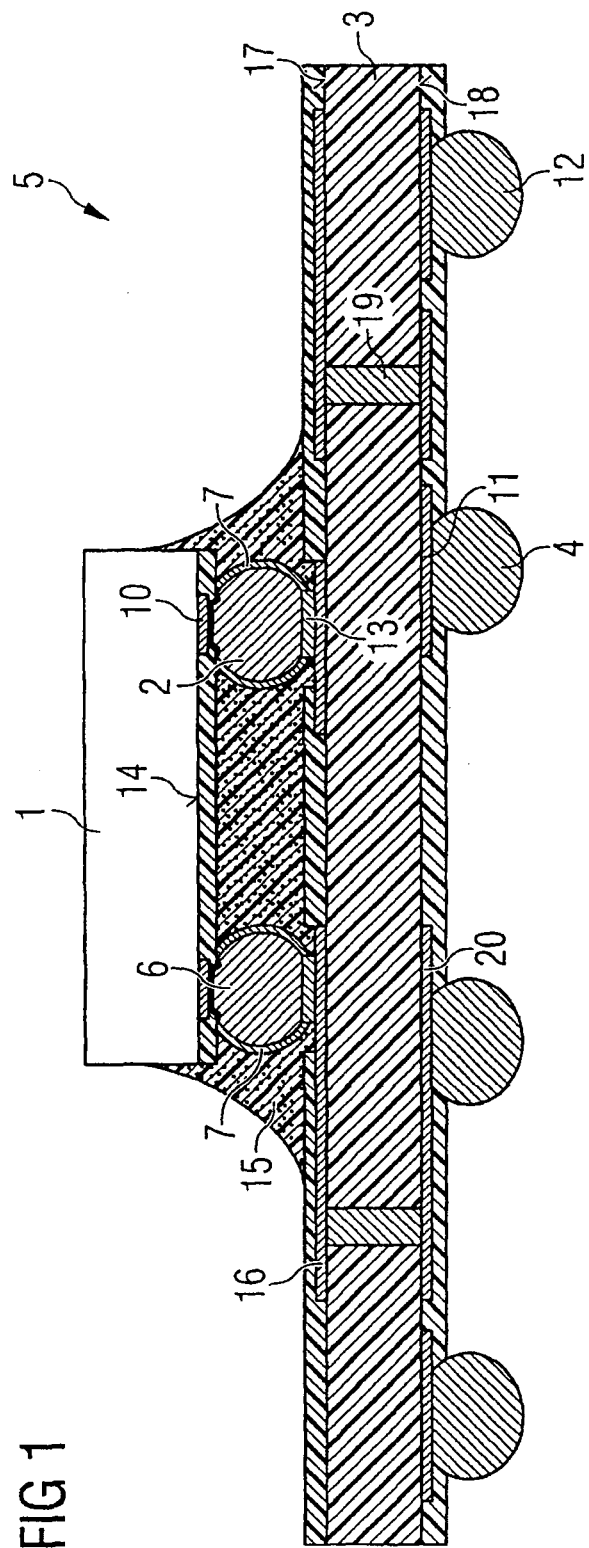
FIG. 1 shows a schematic cross-sectional view of a semiconductor device for radio frequency applications, according to an embodiment.

The semiconductor device according to an embodiment has the advantage that the surface of said inside bumps is protected against corrosion, erosion an electro migration and particularly said inside bumps have a lower skin resistance than conventional flip chip bumps.

Inside bumps of an alloy of Sn/Ag have a five times higher resistivity than the same bumps coated with gold or an alloy of gold. Inside bumps of an alloy of Sn/Pb (63/37) have a six times higher resistivity than the same bumps coated with gold or an alloy of gold. Inside bumps of an alloy of Sn/Pb (5/95) have more than an eight times higher resistivity than the same bumps coated with gold or an alloy of same. Though gold has a resistivity close to copper it is not necessary to form the total bump out of gold.

Actually the core material can even be an elastomer since the conductance for radio frequency energy is governed by a skin effect, so that the resistivity of the coating layer material is essential and the resistivity of the core material is negligible.

In one embodiment, the core of the inside bumps comprises copper or an alloy of same. This core material has the advantage of the lowest resistivity of non noble materials. Further, it has the advantage that copper bumps can be produced by applying a galvanic plating method, performing by one parallel process step hundreds of copper bumps on a semiconductor wafer as described below. Copper bumps as inside bumps have the additional advantage that they can be produced in a column like shape with a high variety of their cross sectional shapes like polygonal, rectangular, square shaped or circle like cross sections. Furthermore the direct current resistivity of copper is smaller than that of solder bumps, so that integrated circuits for radio frequency can be supplied with direct current energy by minimum losses.

Nevertheless the most convenient shape of the core and most inexpensive core material is a ball shaped bump comprising solder. As long as no direct current has to be conducted with a superimposed radio frequency current, solder or elastomers may be preferred as core material for inside bumps.

In one embodiment, said core material, having a ball shape or a column shape, comprises a cap of solder, which eases the connection to said landing pads of said redistribution substrate. In this case, the inside bump with its cap of solder is coated with a layer of gold or alloys of gold. In this case the solder material of the solder cap for fixing the inside bumps to a redistribution substrate is bridged by a low resistivity coating layer of gold or its alloys to increase the radio frequency performance.

To release the thermal stresses caused by the different thermal expansion coefficient of semiconductor silicon and the material of the redistribution substrate like fibre reinforced epoxy resin, an underfill material of filled plastic like polyamide filled with ceramic particles is provided between the semiconductor chip and the redistribution substrate.

The redistribution structure of the redistribution layer comprises a copper alloy which is coated by a noble metal or aluminium at the contact pads carrying inside bumps. Between the copper layer and the noble metal layer often a nickel layer as diffusion barrier layer is provided to prevent diffusion of copper into the noble metal.

A method for producing a semiconductor device for radio frequency applications having a semiconductor chip comprising an integrated circuit accommodated in a radio frequency package with bumps as inside contacts and bumps as outside contacts, comprises the following method steps:

At first a semiconductor wafer with a plurality of semiconductor chip positions is provided, wherein the semiconductor chips comprise high frequency integrated circuits with contact pads on the active surface of said semiconductor chips. Then a core material is deposited for inside bumps an said contact pads. After said deposition a coating is performed by depositing a noble metal on to said core material, whilst protecting the surfaces of adjacent structures of said semiconductor wafer surface. Then a semiconductor wafer is cut into a plurality of single semiconductor chips. Such a semiconductor chip with its coated inside bumps is than mounted on a redistribution substrate having outside contact pads. Finally there are outside bumps positioned on said outside contact pads.

This method may have the advantage that the electrical performance of the interconnect between the integrated circuit of the semiconductor device and the redistribution substrate is enhanced. Furthermore this method may have the advantage that the inside contacts and their coatings are performed on an semiconductor wafer parallel for a plurality of semiconductor devices having inside bumps.

The gap between the semiconductor surface and the redistribution surface provided by said inside bumps can be advantageously filled with an underfill material. This underfill material is a plastic material filled with ceramic particles to protect the inside bumps from being delaminated from said semiconductor chip due to differences in the thermal expansion coefficients between said semiconductor chip and the material of the redistribution substrate like fibre reinforced epoxy resin.

The deposition of core material on said contact pads may preferably be performed by a galvanic deposition of copper or copper alloys on said contact pads. This can be achieved by the following procedure. At first a photoresist of a thickness according to the preferred height of a designed copper column can be deposited on the surface of a wafer providing a plurality of integrated radio frequency circuits. Then a mask illumination and a developing of a structure of holes into that photoresist layer is done. Next a sputtering of an electrically conductive material onto the structured and hardened photoresist layer is performed to get a closed coating of an electrically conductive layer of a thickness of only several Nanometers. Next a deposition of copper onto that coating layer by galvanic or electroless plating and a filling of said holes within said photoresist layer by copper or by an alloy of same is performed. Finally, a removing of the copper layer on top of the photoresist and a removing of the photoresist by reactive ion etching is done. These steps result in copper columns extending from the wafer surface on each contact pad of the wafer.

In another process, the depositing of a core material on said contact pads can be performed by soldering solderballs on said contact pads. This can be performed by forming columns of solder material with a process described above and by heat treating the columns of solder, so that a ball shape is achieved on each contact pad by surface tension effect.

An other possibility to achieve solder balls fixed on the contact pads is to fill a cavity block having a plurality of cavities with solder balls and attaching same by a reflow process towards the wafer under heat and pressure. During this reflow process the solder balls are bonded to the contact pads of the wafer.

Alternatively it is possible to deposit a core material on said contact pads by performing a printing of an elastomeric material on said contact pads. This printing can be done by jet printing or screen printing and results immediately in bumps of core material.

On top of said inside bumps of core material, one can deposit a cap of solder material by one of the depositing processes described above. After said inside bumps of core material are deposited on said contact pads, a coating with a noble metal is performed by dipping said inside bumps in an electroless bath for gold plating, or by chemical (CVD) or physical vapour deposition (PVD) of a noble metal onto said inside bumps of core material. A physical vapour deposition of noble metal can be performed preferably by sputter deposition or by plasma deposition.

With the present embodiments, the skin resistivity of solder interconnects is approved which increases the electrical performance of the package for radio frequency semiconductor devices. Though there is the possibility to replace the solder material by copper column bumps, a major disadvantage of using copper column bumps is that copper is not as compliant as solder. In most cases this method still relies on a Sn-coating on top of the copper column bump to form the electrical interconnection to the substrate. By using this Sn-coating the electric interconnect performance is further reduced.

To enhance the conductivity of the interconnect, a thin layer of gold can be coated on to the solder or even onto copper or even an elastomere. Gold has a better electrical conductivity than Sn or an elastomere and can therefore enhance the performance of the interconnect bumps. Especially for radio frequencies, the electrical interconnect performance can be degraded if the design and/or the materials are not properly optimised for these radio frequencies. Therefore, a thin gold coating of about 1-2 Micrometer on the surface of a solder joint can be used to reduce the skinlosses at high operating frequencies. This is possible because gold has a low resistivity value, very close to copper. The resistivity value is at least five times lower than SnAg and six to eight times lower than eutectic SnPb and high Pb respectively.

FIG. 1 shows a schematic cross sectional view of a semiconductor device 5 for radio frequency applications, according to an embodiment. Reference sign 1 designates a semiconductor chip 1 of silicon having an integrated circuit provided on its active surface 14. On this active surface 14 contact pads 10 are electrically connected to integrated circuits. On this contact pads 10 interconnect bumps, called inside bumps 2, are positioned, to connect electrically the semiconductor chip 1 to a redistribution substrate 3.

The semiconductor chip 1 is mechanically connected with the redistribution substrate 3 by an underfill 15 material filling the gap between the active surface 14 of the semiconductor chip 1 and the redistribution substrate 3. This underfill 15 material comprises an epoxy resin filled with ceramic particles. The inside bumps 2 comprises a core 6 which is coated by a layer 7 of noble metal. The inside bumps 2 are fixed to landing pads 13 of said redistribution substrate 3. The landing pads on the upper surface 17 of the redistribution substrate 3 are connected through stripconductors 16 on the upper surface 17 and vias conductors 19 to stripconductors 20 on the bottom surface 18 of the redistribution substrate 3. The stripconductors 20 are connected with outside contact pads 11 on the bottom surface 18 of the redistribution substrate 3.

On the outside contact pads 11 outside bumps 4 with their ball shapes 12 are attached. The outer dimensions of the inside bumps 2 are about one order of magnitude smaller than the outer dimensions of the outside bumps 4. The inside bumps 2 have a diameter of several tens of micrometer and the outside bumps 4 have diameters of several hundreds of micrometers to be able to be connected to a much larger printed board.

FIG. 2 shows a schematic cross sectional view of an inside bump 2, according to a first embodiment. Components with the same function as in FIG. 1 are defined by the same reference sign and will not be explained again. FIG. 2 is an enlarged schematic cross sectional view of just one inside bump 2 which is made of solder material. As one can see from Table 1 the resistivity of such solder balls 12 is quite high.

TABLE 1

| Material | Resistivity ('Ωm) |
|---|---|
| Au | $2.35 \times 10^{-8}$ |
| Cu | $1.673 \times 10^{-8}$ |
| SnAg | $12.31 \times 10^{-8}$ |
| SnPb (63/37) | $14.8 \times 10^{-8}$ |
| SnPb (5/95) | $20.1 \times 10^{-8}$ |

Since the conductivity for radio frequency applications is governed by the skin effect, this high resistivity of the solder material will impair the radio frequency performance of such interconnect contacts. To solve this problem FIG. 2 shows the layer 7 made of gold surrounding the solder bump. As shown in Table 1 gold a resistivity close to copper and the conductivity of gold is five times higher than the conductivity of solder. Therefore the radio frequency performance of the interconnect bumps 2 will be improved. The core 6 in this case is solder but it can also be an elastomere since the resistivity of the core material is negligible for radio frequency applications.

FIG. 3 shows a schematic cross sectional view of an inside bump 2, according to a second embodiment. This inside bump 2 has a core 6 made of a copper alloy. Though copper has a low resistivity, this cylindrical column 8 of copper is attached to the landing pad 13 by a cap 9 of solder. This cap 9 of solder reduces the performance of this interconnect bump for high radio frequency applications. To overcome this disadvantage most parts of this cylindrical column 8 of copper and solder are coated by a layer 7 of gold. This interconnect bump has the advantage, that it is not only applicable for radio frequency but can also transfer direct current superimposed by radio frequencies with minimum losses.

What is claimed is:

1. A semiconductor device for radio frequency applications, comprising:
    a semiconductor chip comprising a radio frequency integrated circuit, the semiconductor chip having a plurality of contact pads and being accommodated in a radio frequency packaging,
    inside bumps configured as inside contacts between the semiconductor chip and a redistribution substrate, the redistribution substrate having a plurality of pads,
    outside bumps configured as outside contacts of said semiconductor device mounted on said redistribution substrate,
    an underfill material containing ceramic particles and filling a gap between the semiconductor chip and the redistribution substrate, wherein said inside bumps each has a plastic core, and
    a coating layer of a noble metal covering only an entire surface of each of the plastic cores that extends between the semiconductor chip and the redistribution substrate and that does not contact any of the contact pads of the semiconductor chip,
    wherein each of the plastic cores physically contacts both one of the contact pads of the semiconductor chip and one of the pads of the redistribution substrate.

2. The semiconductor device according to claim 1, wherein the noble metal comprises gold or an alloy of gold.

3. The semiconductor device according to claim 1, wherein each of said plastic cores comprises an elastomer.

4. The semiconductor device of claim 1, wherein each of the inside bumps has only a single coating of the coating layer of the noble metal.

5. A semiconductor device for radio frequency applications, comprising:
    a semiconductor chip comprising a radio frequency integrated circuit, the semiconductor chip having a plurality of contact pads and being accommodated in a radio frequency packaging,
    inside bumps configured as inside contacts between the semiconductor chip and a redistribution substrate, and outside bumps configured as outside contacts of said semiconductor device mounted on said redistribution substrate, said redistribution substrate having a plurality of pads;
    an underfill material containing ceramic particles and filling a gap between the semiconductor chip and the redistribution substrate, wherein said inside bumps each has a metallic core comprising solder material; and
    a coating layer of a noble metal covering only an entire surface of each of the metallic cores that between the semiconductor chip and the redistribution substrate and that does not contact any of the contact pads of the semiconductor chip,
    wherein each of the metallic cores physically contacts both one of the contact pads of the semiconductor chip and one of the pads of the redistribution substrate.

6. The semiconductor device according to claim 5, wherein each of said metallic cores comprises copper or an alloy of same.

7. The semiconductor device according to claim 5, wherein each of said metallic cores has a shape of a ball comprising solder.

8. The semiconductor device according to claim 5, wherein each of said metallic cores has a shape of a cylindrical column comprising copper.

9. The semiconductor device according to claim 5, wherein each of said metallic cores comprises a cap of solder, and wherein each of said metallic cores including said cap is covered by the coating layer of the noble metal.

10. The semiconductor device according to claim 5, wherein said noble metal comprises gold or an alloy of gold.

11. The semiconductor device according to claim 5, wherein each of said metallic cores has a shape of a ball.

12. The semiconductor device of claim 5, wherein each of the inside bumps has only a single coating of the coating layer of the noble metal.

* * * * *

UNITED STATES PATENT AND TRADEMARK OFFICE
CERTIFICATE OF CORRECTION

PATENT NO. : 8,610,266 B2  Page 1 of 1
APPLICATION NO. : 11/470056
DATED : December 17, 2013
INVENTOR(S) : Kai Chong Chan et al.

It is certified that error appears in the above-identified patent and that said Letters Patent is hereby corrected as shown below:

In the claims,

Column 6, Claim 5, Line 28:
Please delete "the between" and replace with --that extends between--

Signed and Sealed this
Third Day of November, 2015

Michelle K. Lee
*Director of the United States Patent and Trademark Office*